(12) United States Patent
Johnson et al.

(10) Patent No.: US 7,287,189 B1
(45) Date of Patent: Oct. 23, 2007

(54) I/O CONFIGURATION AND RECONFIGURATION TRIGGER THROUGH TESTING INTERFACE

(75) Inventors: Brian D. Johnson, Sunnyvale, CA (US); Keith Duwel, Los Gatos, CA (US); Mario Guzman, San Jose, CA (US); Christopher F. Lane, San Jose, CA (US); Andy L. Lee, San Jose, CA (US)

(73) Assignee: Altera Corporation, San Jose, CA (US)

( * ) Notice: Subject to any disclaimer, the term of this patent is extended or adjusted under 35 U.S.C. 154(b) by 523 days.

(21) Appl. No.: 10/603,888

(22) Filed: Jun. 25, 2003

(51) Int. Cl.
    *G06F 11/00* (2006.01)
(52) U.S. Cl. .................. 714/32; 714/30; 714/725; 714/727
(58) Field of Classification Search .............. 714/31, 714/32, 33, 725, 727, 30
    See application file for complete search history.

(56) References Cited

U.S. PATENT DOCUMENTS

| | | | |
|---|---|---|---|
| 5,443,320 A | | 8/1995 | Agata et al. |
| 6,067,648 A | * | 5/2000 | Hunter et al. ............... 714/718 |
| 6,092,941 A | | 7/2000 | Imai |
| 6,208,162 B1 | * | 3/2001 | Bocchino ..................... 326/38 |
| 6,259,271 B1 | * | 7/2001 | Couts-Martin et al. ........ 326/40 |
| 6,285,211 B1 | * | 9/2001 | Sample et al. ................. 326/41 |
| 6,357,939 B1 | | 3/2002 | Baron |
| 6,429,682 B1 | * | 8/2002 | Schultz et al. ................. 326/41 |
| 6,918,027 B2 | * | 7/2005 | Mantey et al. ................. 712/37 |
| 6,931,466 B2 | * | 8/2005 | Wyland ....................... 710/100 |
| 6,978,234 B1 | * | 12/2005 | Battaline et al. ............... 703/28 |
| 7,020,598 B1 | * | 3/2006 | Jacobson ..................... 703/14 |
| 2002/0030716 A1 | | 3/2002 | Watanabe et al. |
| 2002/0093570 A1 | | 7/2002 | Silverbrook |
| 2003/0217306 A1 | * | 11/2003 | Harthcock et al. ............. 714/30 |

FOREIGN PATENT DOCUMENTS

| | | |
|---|---|---|
| JP | 09-118048 | 5/1997 |
| JP | 2001-057586 A | 2/2001 |

OTHER PUBLICATIONS www.pcwebopaedia.com/TERM/M/MEMORY.html.*

* cited by examiner

*Primary Examiner*—Yolanda L Wilson
(74) *Attorney, Agent, or Firm*—Townsend and Townsend and Crew LLP (57) ABSTRACT

A reconfigurable device loads I/O configuration information from a diagnostic interface during testing. The device includes a configurable I/O connection for communicating values with other devices. A diagnostic interface communicates the value of the I/O connection to a tester. A diagnostic controller in the device has a first mode for communicating the value on the I/O connection to the tester via the diagnostic interface, and a second mode for receiving an I/O configuration attribute value for the I/O connection from the diagnostic interface thereby modifying the configuration of the I/O connection. The device also includes a configuration controller that retrieves device configuration information from a configuration device in response to a signal. The signal can originate from an external source or from the diagnostic controller in response to a configuration instruction received via the diagnostic interface. The diagnostic interface may be a JTAG interface.

37 Claims, 6 Drawing Sheets

I/O CONFIGURATION AND RECONFIGURATION TRIGGER THROUGH TESTING INTERFACE

BACKGROUND OF THE INVENTION

The present invention relates generally to the field of reconfigurable devices. Complex printed circuit boards may have hundreds of components and thousands of different connections. Traditional test systems, such as external test probes or "bed of nails" test devices, cannot access the numerous test points on printed circuit boards with more than two layers or with advanced component mounting technologies, such as surface mount, ball grid array (BGA), pin grid array (PGA), or flip-chip mountings. In response to the need to test complex printed circuit boards, diagnostic interfaces began to be integrated into the components and printed circuit board design. One such diagnostic interface standard is a boundary scan testing interface known as IEEE Standard 1149.1, also referred to as JTAG.

Reconfigurable devices, such as programmable logic devices (PLDs), are often included in complicated systems. A PLD is typically composed of a number of functional blocks that use either a combination of logic gates or a look-up table to perform a logic operation. Functional blocks can also include specialized logic devices adapted to a specific logic operation. The functional blocks are interconnected with a configurable switching circuit. The configurable switching circuit establishes connections between the functional blocks, enabling the PLD to perform the intended functions. The configurable switching circuit also establishes connections between some of the functional blocks and the pins of the PLD, so that data can be input to and output from the PLD. The configuration of the switching circuit is determined according to the core configuration information, and the configuration of the PLD pins is determined according to I/O configuration information. The core configuration and I/O configuration information is loaded into the PLD or other reconfigurable device from a separate configuration device.

Testing systems with one or more reconfigurable devices introduces several difficulties. For complex configurations, the process of loading the configuration information into the reconfigurable device can take a long time. This delay makes fine-tuning or debugging a system time-consuming and inefficient, because the configuration information may have to be reloaded numerous times. This problem is exacerbated where the reconfigurable devices support multiple I/O standards for connecting with different variations of the system. In these situations, a complete set of configuration information needs to be loaded prior to testing for each supported I/O standard.

Further, a system cannot be tested until the configurations of the reconfigurable devices are finalized, even if the functions of the reconfigurable devices do not need to be tested. Additionally, a complex system may be distributed over several separate circuit boards. If the configuration device is on a different board than its associated reconfigurable devices, then the circuit boards cannot be tested separately. These factors prevent developers from testing portions of the system as they are completed, increasing the complexity and difficulty of the testing process.

A prior solution to these problems allows configuration information for the entire reconfigurable device to be loaded into the device via the device's diagnostic interface. This allows reconfigurable devices to be tested without a configuration device. However, diagnostic interfaces are typically much slower than the normal configuration connection. Therefore, testing and debugging consume an even greater amount of time. Additionally, when testing multiple I/O standards, this solution still requires a complete set of configuration information to be loaded for each I/O standard to be tested. Moreover, a system cannot be tested until the configurations of the reconfigurable devices are finalized.

This solution also introduces its own problems. Because configuration information is loaded into reconfigurable devices through the diagnostic interface, the testing equipment must have a complete and up to date set of configuration information. The testing equipment must also be able to coordinate the sequence of events needed to load the configuration information into a reconfigurable device. This greatly increases the complexity and expense of the testing equipment.

Following the completion of system testing, the system needs to be returned to its original state. This often includes reconfiguring the reconfigurable devices back to their initial configurations. This can be done by either resetting the entire system, or by loading the initial configurations into the reconfigurable devices via the diagnostic interface. These techniques are both time-consuming and difficult.

It is desirable to be able to: 1) quickly and efficiently test and debug systems having reconfigurable devices; 2) test reconfigurable devices with multiple I/O standards without having to load a complete set of configuration information; 3) test systems prior to finalizing the configuration of the reconfigurable devices; and 4) test circuit boards having reconfigurable devices separately even if the board does not include a reconfiguration device. Following the completion of testing, it is further desirable to be able to trigger the reconfiguration of a reconfigurable device through the diagnostic interface to return the reconfigurable device to its initial configuration.

BRIEF SUMMARY OF THE INVENTION

The invention, generally, is a device adapted to load I/O configuration information from a diagnostic interface during testing. An embodiment of the invention includes an I/O connection for communicating I/O values with other devices. An I/O value is the data that is either input to or output from an I/O connection. The I/O connection has at least one configurable attribute. A configurable attribute defines one or more aspects of the behavior of an I/O connection. A configurable attribute can have one or more attribute values, which determine the specific behavior of the I/O connection. The device also includes a configuration memory for storing the attribute value of the configurable attribute, thereby configuring the attribute of the I/O connection. The device includes a diagnostic interface for communicating the value of the I/O connection to a tester. A diagnostic controller included in the device has a first mode for communicating the value of the I/O connection to the tester via the diagnostic interface. The diagnostic controller has a second mode for receiving an attribute value for the I/O connection from the diagnostic interface and storing the received attribute value in the configuration memory, thereby modifying the attribute of the I/O connection.

In an embodiment, the second mode of the diagnostic controller further reads a previously stored attribute value stored in the configuration memory and sends the stored attribute value to the tester via the diagnostic interface. In a further embodiment, the I/O configuration memory is a shift register. The shift register stores a first attribute value of the I/O connection shifted into the shift register, and outputs a previously stored second attribute value of the I/O connection shifted out of the shift register.

In an embodiment, the diagnostic interface comprises a serial data connection. In a further embodiment, the serial data connection receives a second value of an I/O connection from a second device. The device sends the second value of the I/O connection to a third device via the serial data connection. In an additional embodiment, the diagnostic interface is a JTAG interface.

In a further embodiment, the device includes a configuration interface for receiving a set of attribute values for the configurable attributes of the device from a configuration device. A configuration controller stores the set of attribute values in the configuration memory, thereby configuring the configurable attributes of the device. In another embodiment, the set of attribute values include an attribute value of the I/O connection. In yet another embodiment, the second mode of the diagnostic controller disables the configuration controller.

In an additional embodiment, the configuration controller receives a signal and retrieves the set of attribute values in response to the signal. In one embodiment, the signal is received from a source external to the device. In an alternate embodiment, the signal is received from the diagnostic controller. In a further alternate embodiment, the diagnostic controller includes a third mode for receiving a configuration instruction from the diagnostic interface and generating the signal in response to the configuration instruction.

In an embodiment, the device is an integrated circuit. In another embodiment, the device is a programmable logic device. In yet another embodiment, a system having a plurality of devices connected with the device. The system can further include a circuit board with a plurality of devices mounted thereto.

BRIEF DESCRIPTION OF THE DRAWINGS

The invention will be described with reference to the drawings, in which.

DETAILED DESCRIPTION OF THE INVENTION

The present invention addresses the difficulties associated with testing systems having reconfigurable devices by allowing I/O configuration information to be independently loaded into reconfigurable devices via the diagnostic interface. This allows testing of reconfigurable devices with multiple I/O standards. Additionally, because the I/O configuration information is typically only as small portion of the complete set of configuration information, the I/O configuration information can be loaded relatively quickly through the diagnostic interface. Thus, the present invention enables quick and efficient testing and debugging of systems with reconfigurable devices. Moreover, the system can be tested with only the I/O configuration information, eliminating the need to finalize the configuration of the reconfigurable devices. Further, circuit boards without configuration devices can be tested separately. In an embodiment, the present invention can also trigger the reconfiguration of a reconfigurable device through the diagnostic interface without using an incompatible diagnostic connector.

Figure 1:
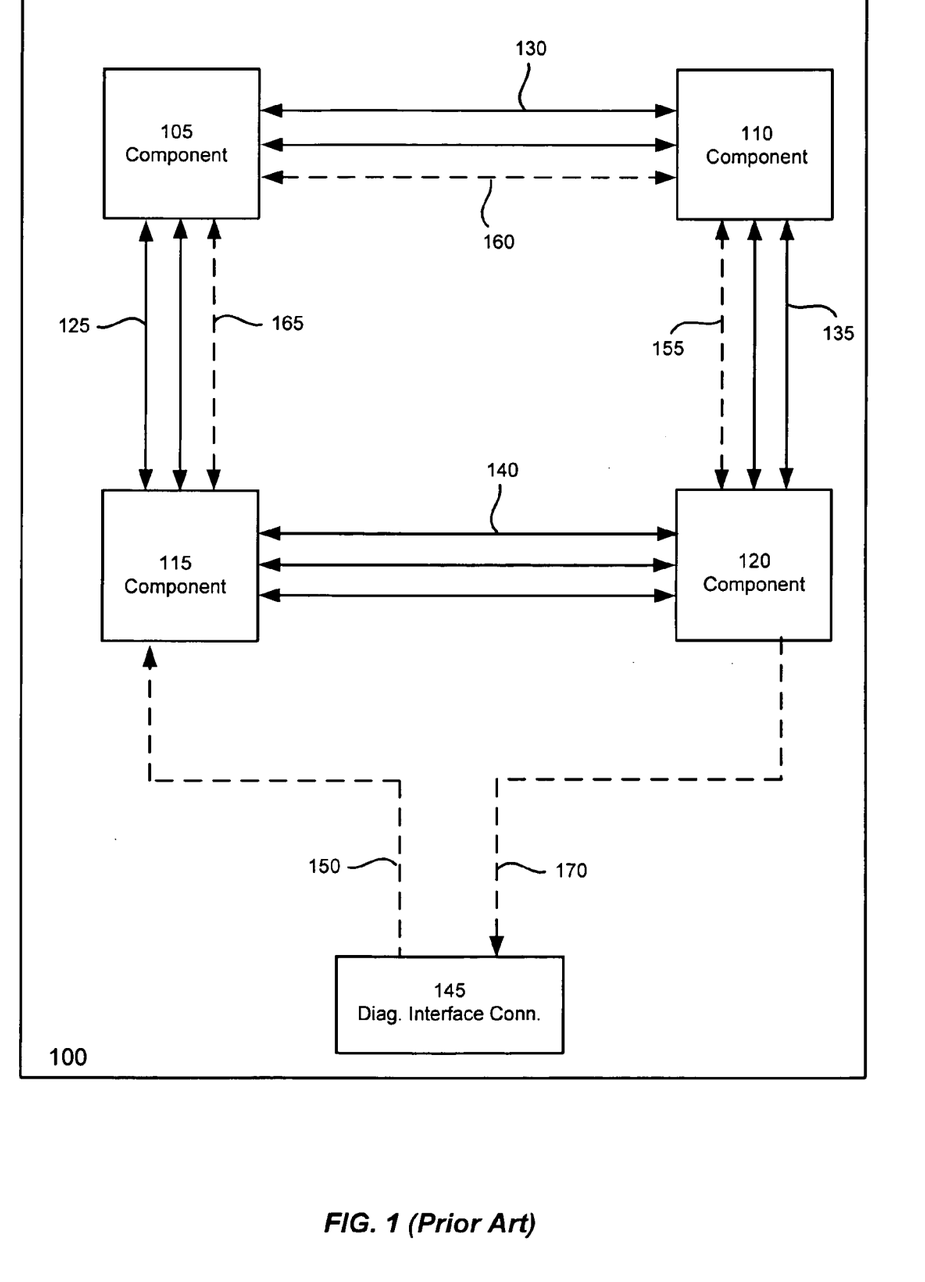
FIG. 1 illustrates a system with a diagnostic interface.

In response to the need to test complex printed circuit boards, diagnostic interfaces began to be integrated into the components and printed circuit board design. One such diagnostic interface standard is a boundary scan testing interface known as IEEE Standard 1149.1, also referred to as JTAG. FIG. 1 illustrates a system with a diagnostic interface. The system includes a printed circuit board 100 having integrated circuit components 105, 110, 115, 120. Integrated circuit components 105, 110, 115, and 120 can be any type of analog or digital devices. The integrated circuit components are connected with each other via a number of circuit traces 125, 130, 135, and 140. Each circuit trace is electrically connected with at least one integrated circuit component. The integrated circuit components each have electrical contacts, referred to as pins, for connecting with one or more circuit traces. Printed circuit board 110 is intended for illustration and the number and arrangement of integrated circuit devices and circuit traces will vary. Typical integrated circuit components may have from 100 pins up to 1000 pins, depending upon the complexity of the components.

A diagnostic interface connector 145 is integrated with the printed circuit board 100. The diagnostic interface connector is adapted to connect with an external testing device. The external testing device includes hardware and software for reading and writing test values through the diagnostic interface. The diagnostic interface connector 145 is also connected with diagnostic electrical contacts or pins on the integrated circuit components 115 and 120 through diagnostic circuit traces 150 and 170. Additional diagnostic circuit traces 155, 160, and 165 connect with similar electrical contacts or pins on the integrated circuit components 105 and 110.

Diagnostic circuit traces 150, 155, 160, 165 and 170 form a serial data bus for communicating test values between the integrated circuit components and the diagnostic interface. Diagnostic interface connector 145 drives test values into the printed circuit board 100 through diagnostic circuit trace 150. Simultaneously, test values are driven out of the printed circuit board 100 through diagnostic circuit trace 170. Diagnostic circuit traces 155, 160, and 165 carry test values between integrated circuit components.

While driving new test values through the printed circuit board, the test values at selected pins of the integrated circuit components can be captured and driven out of the printed circuit board through the diagnostic interface connection 145. The external testing device can compare the captured test values with corresponding expected values to test the integrity of connections between different pins. For example, a test value can be driven onto a pin at one end of a given circuit trace. Simultaneously, test values are captured at the other ends of the circuit trace. By comparing the driven test value at one end of a circuit trace with the values captured at the other end, the integrity of the circuit trace is tested.

Figure 2:
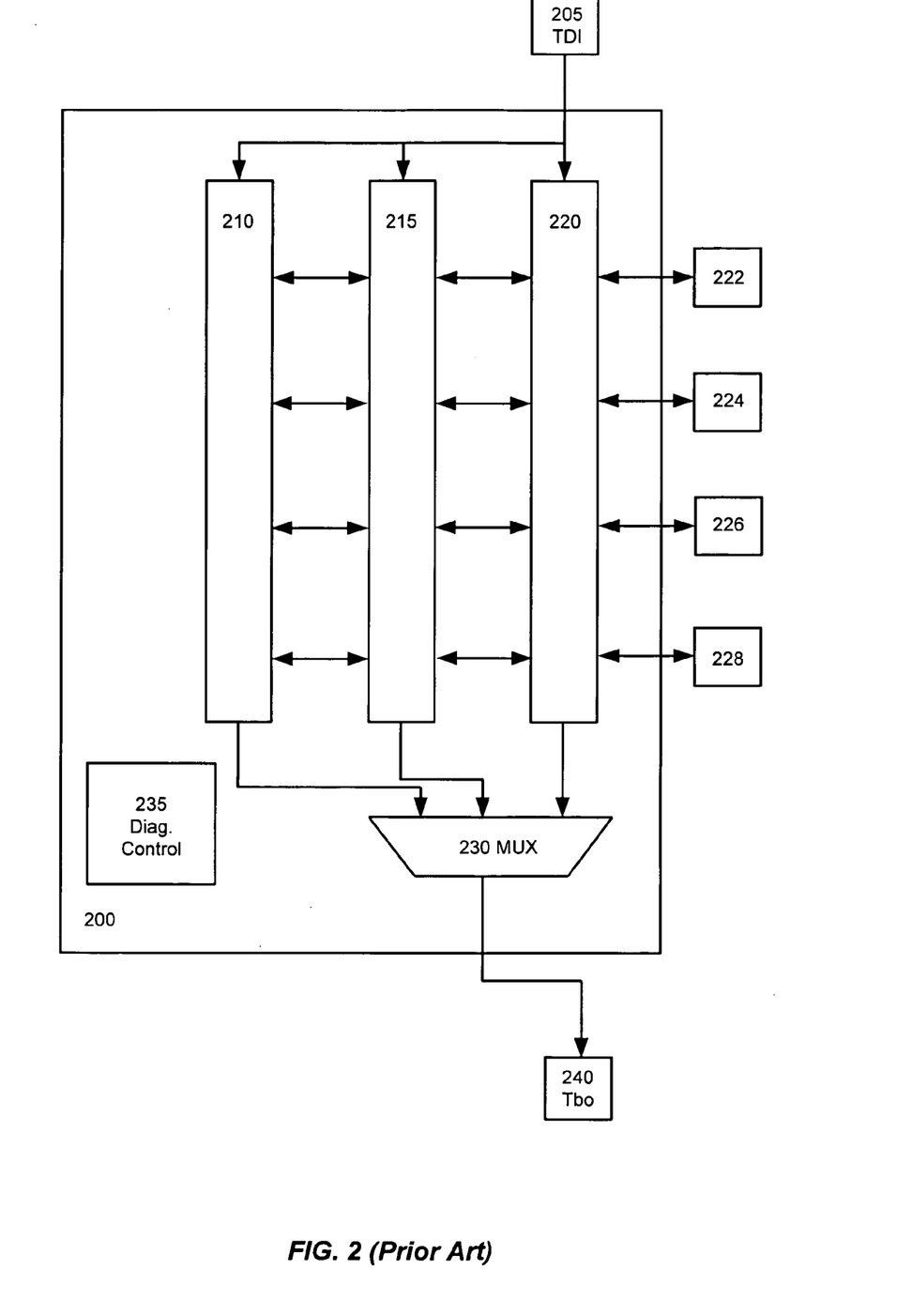
FIG. 2 illustrates a device with a diagnostic interface.

FIG. 2 illustrates an integrated circuit device 200 with a diagnostic interface. A test data in (TDI) pin 205 receives test data from the diagnostic interface connector or from other integrated circuit devices, as explained below. Test data is distributed to one of the three data registers 210, 215, and 220. Data registers 210, 215, and 220 are binary data shift registers configured to shift data in from TDI pin 205 and simultaneously shift data out to test data out (TDO) pin 240. TDO pin 240 can be connected with a similar TDI pin on another integrated circuit device. In this manner, test values are carried to all of the integrated circuit devices on a printed circuit board.

Data registers 210, 215, and 220 are connected with pins 222, 224, 226, and 228. Pins 222, 224, 226, and 228 are intended for illustration, and the number and arrangement of pins on integrated circuit devices will vary according to the function and complexity of the integrated circuit device. Data registers 210, 215, and 220 each associate at least one of its bits with each pin of the integrated circuit device 200. Data register 220 is a data capture register adapted to capture test values from pins 222, 224, 226, and 228 on the integrated circuit device 200. Data register 215 is a data output register adapted to drive test values onto pins 222, 224, 226, and 228.

Data register 210 is an output enable register adapted to independently connect each of the pins 222, 224, 226, and 228 with either the data capture register 220 or the data output register 215. Each bit of the output enable register 210 is associated with one of the pins of the integrated circuit device. The value of each bit determines whether a test value from data output register 215 is driven onto the associated pin, or whether the value of the associated pin is captured by data capture register 220. In this manner, test values can be driven on one set of pins while simultaneously captured on another set of pins.

Output multiplexer 230 alternately communicates the data shifted out of data registers 210, 215, and 220 to TDO pin 240. The operations of data registers 210, 215, and 220, and the multiplexer 230 are coordinated by the diagnostic controller 235. The diagnostic controller 235 is adapted to receive standardized instructions through TDI pin 205. Based upon the instruction received, the diagnostic controller loads test data from TDI pin 205 into data register 210, 215, or 220. The diagnostic controller data also shifts out test data from data register 210, 215, or 220 to TDO pin 240 via multiplexer 230. The diagnostic controller 235 can further require additional control pins for operation. For example, the JTAG specification calls for a five pin interface that includes a test data in pin, a test data out pin, a clock pin for synchronizing serial data communication, a command pin, and a reset pin.

Figure 3:
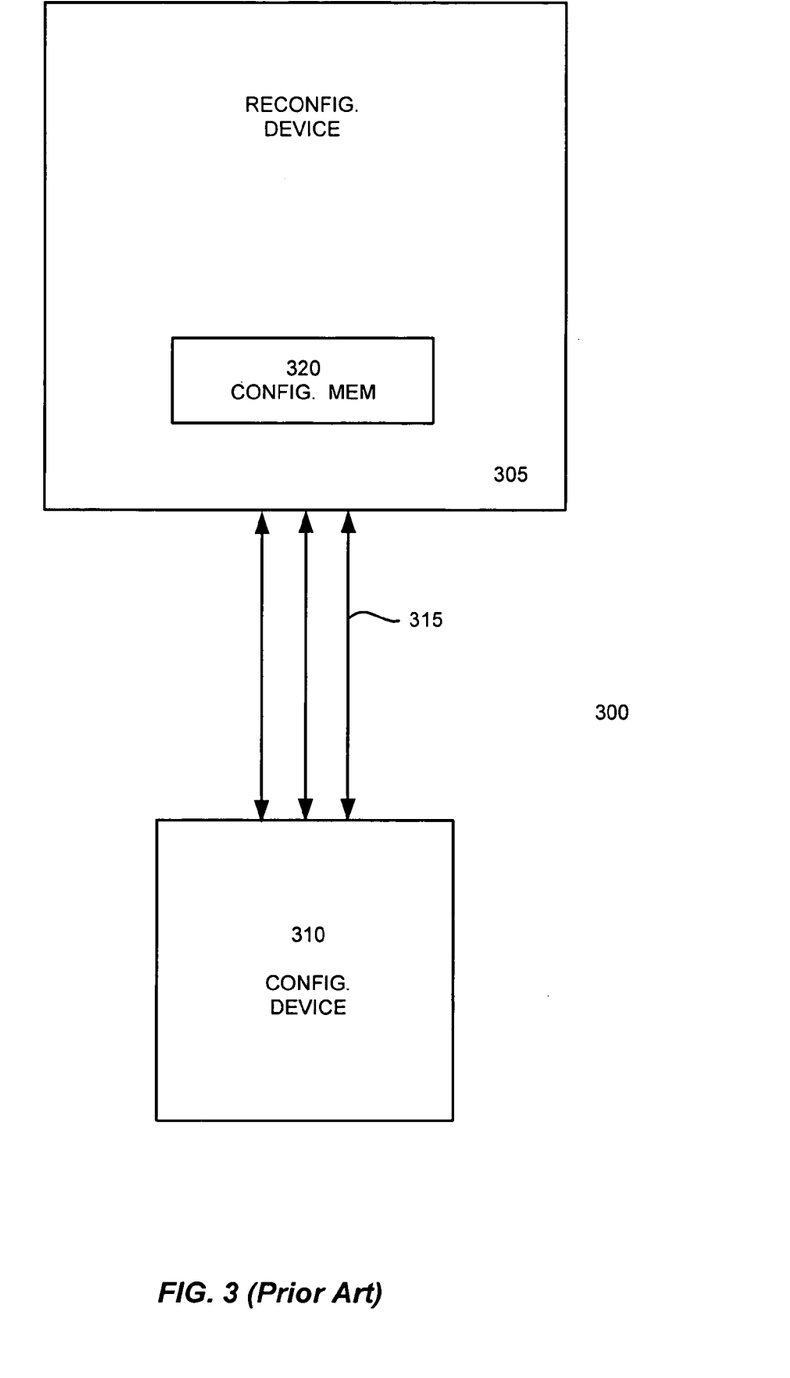
FIG. 3 illustrates a system with a reconfigurable device.

FIG. 3 illustrates a system 300 with a reconfigurable device 305. The reconfigurable device 305 can be configured according to configuration information to perform different functions. The configuration information for the reconfigurable device is stored in a configuration memory 320. Configuration information can be divided into core configuration information, which defines the functions of the reconfigurable device 305, and I/O configuration information, which defines the configuration of the various input and output connections or pins (I/O connections) of the reconfigurable device 305. The configuration of I/O connections may include, for example, whether the I/O connection is an input or an output, impedance values, voltage input or output levels, and/or current input and output levels. For some reconfigurable devices, the core configuration information and the I/O configuration information may be stored in separate memories.

An example of a reconfigurable device is a programmable logic device (PLD). A PLD is typically composed of a number of functional blocks that use either a combination of logic gates or a look-up table to perform a logic operation. Functional blocks can also include specialized logic devices adapted to a specific logic operation. The functional blocks are interconnected with a configurable switching circuit. The configurable switching circuit establishes connections between the functional blocks, enabling the PLD to perform the intended functions. The configurable switching circuit also establishes connections between some of the functional blocks and the pins of the PLD, so that data can be input to and output from the PLD. The configuration of the switching circuit is determined according to the core configuration information, and the configuration of the PLD pins is determined according to I/O configuration information.

A configuration device 310 is connected with the reconfigurable device 305. The configuration device 310 contains a copy of the configuration information for the reconfigurable device 205. The configuration information can be stored in a non-volatile memory in the configuration device 310. The configuration device 310 is connected with the reconfigurable device through configuration connection 315. The configuration device 310 is adapted to load the configuration information into the reconfigurable device 305 through configuration connection 315 upon receiving a request from the reconfigurable device 305. This loading process is typically a sequence of events for sending configuration information to the reconfigurable device 305 and verifying that the configuration information was received and loaded correctly. Although shown in FIG. 3 as a single device, the configuration device 310 can be a general-purpose processor coupled with an integrated or separate memory device. Alternatively, the configuration device 310 can be a memory device specifically adapted to communicate configuration information with a reconfigurable device 305.

Figure 4:
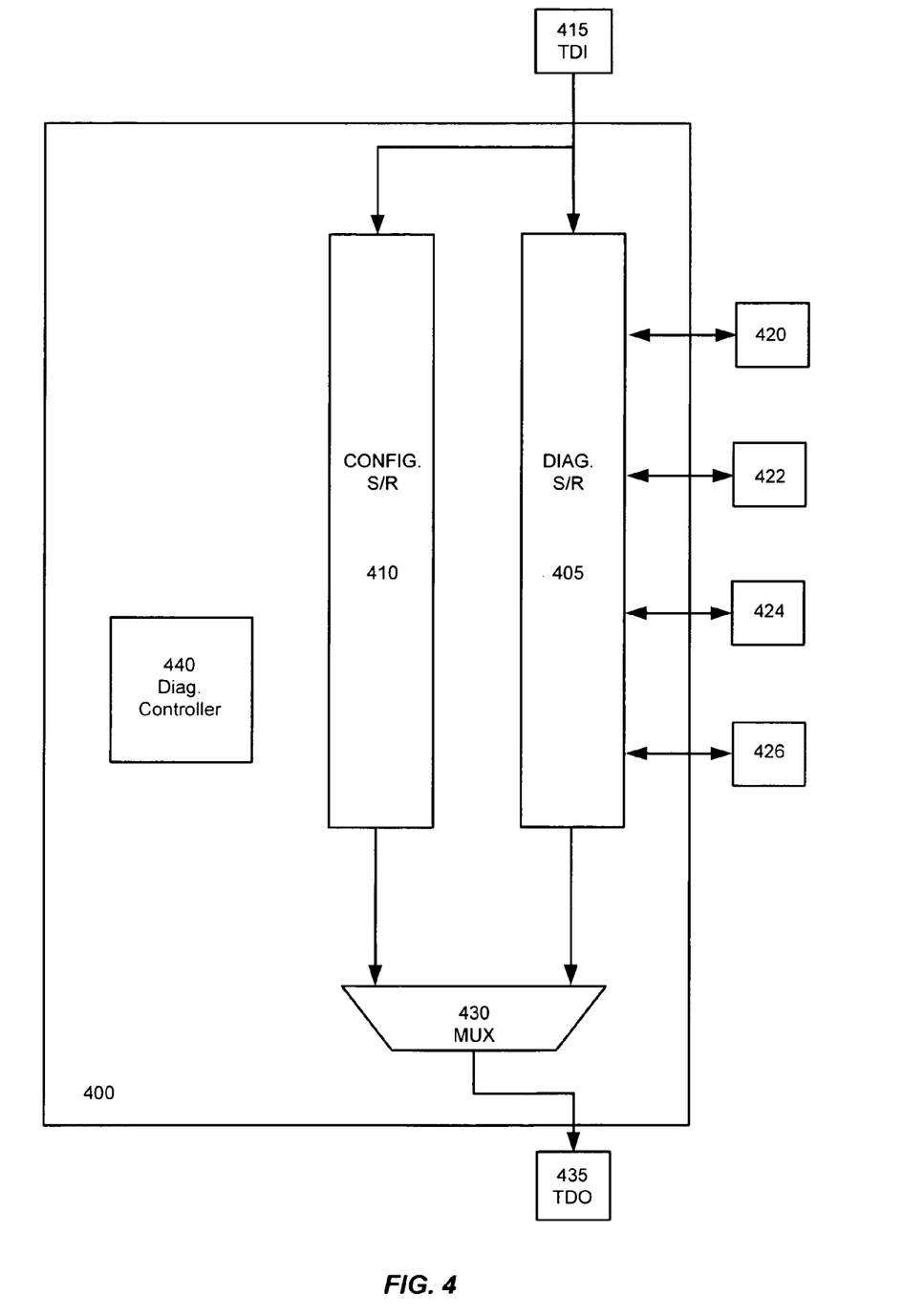
FIG. 4 illustrates a device having reconfigurable I/O connections according to an embodiment of the invention.

FIG. 4 illustrates a reconfigurable device 400 having reconfigurable I/O connections according to an embodiment of the invention. Reconfigurable device 400 includes reconfigurable I/O connections 420, 422, 424, and 426. The number of the I/O connections is intended for illustration. Reconfigurable devices can have any number of I/O connections, depending upon the type of reconfigurable device. Typical reconfigurable devices have anywhere from 100 to over 1000 reconfigurable I/O connections.

Each of the I/O connections 420, 422, 424, and 426 can be independently configured to send and/or receive data from other devices or components in a system. In an embodiment, the configuration of each I/O connection is determined by a number of different properties. Examples of I/O connection properties include whether the I/O connection is an input or an output, impedance values, voltage input or output levels, and current input or output levels. Further, I/O connections can be connected to phase-locked loops or other specialized circuits within device 400, and the I/O connection properties can specify the operating parameters, such as bandwidth or feedback values, for the specialized circuits.

The value of properties associated with each I/O connection is specified by I/O configuration information stored in configuration shift register 410. The configuration shift register can be loaded with I/O configuration information during the normal reconfiguration process. In an embodiment, the I/O configuration information is loaded into the configuration shift register with one or more parallel load operations. In an embodiment, the configuration shift register 410 is also a shift register and can serially load I/O configuration information, as discussed below. The configuration shift register associates a number of its bits with each I/O connection to fully specify the properties assigned to it. For example, a single typical I/O connection may require approximately 25 bits in the configuration shift register 410.

In addition to the configuration shift register, an embodiment of the invention includes a separate core configuration memory for storing the core configuration information loaded into the device.

Diagnostic registers 405 are also connected with the I/O connections 420, 422, 424, and 426. The diagnostic registers 405 can include a data capture register, a data output register, and an output enable register, as discussed above. The purpose of the diagnostic registers is to capture or output test values during testing operations. During normal operation of the device 400, diagnostic registers 405 are unused.

In an embodiment, both the diagnostic registers 405 and the configuration shift register 410 are connected to a test data in (TDI) connection 415, which is part of the diagnostic interface. During testing operations, TDI connection 415 is used to load test commands and test data into the device 400. The diagnostic registers 405 and the configuration shift register 410 are also connected with test data out (TDO) connection 435 through multiplexer 430. Multiplexer 430 alternately communicates the data shifted out of each of the diagnostic registers 405 to TDO pin 435. Additionally, the multiplexer 430 is also connected with the configuration shift register 410, so I/O configuration information can also be shifted out of the configuration shift register 410 to TDO connection 435.

The operations of diagnostic registers 405 and the multiplexer 430 are coordinated by the diagnostic controller 440. The diagnostic controller 440 is additionally capable of coordinating the transfer of I/O configuration information between the configuration shift register 410 and the TDI connection 415 and TDO connection 435. This additional functionality of the diagnostic controller 440 is enabled through one or more non-standard diagnostic instructions. The non-standard diagnostic instructions direct the configuration shift register 410 to load I/O configuration information from the TDI connection 415 and/or to output I/O configuration information already in the configuration shift register 410 to TDO pin 435. I/O configuration information shifted out of the configuration shift register 410 can be communicated with an external testing device through the diagnostic interface, in a similar manner to the captured test value discussed above.

Like other diagnostic instructions, the non-standard diagnostic instructions are communicated to the diagnostic controller 440 through the TDI connection 415. The diagnostic controller 440 is adapted to be responsive to both standardized diagnostic instructions pertaining to the operation of diagnostic registers 405, and to non-standard diagnostic instructions pertaining to the operation of configuration shift register 410. In an embodiment, the diagnostic controller 440 is responsive to standard JTAG instructions. The JTAG standard allows for the definition of additional non-JTAG instructions. These non-JTAG instructions are communicated over the same serial data bus as standard JTAG instructions, eliminating the need for additional pins or circuit traces. Devices not supporting the additional non-JTAG instructions will ignore these instructions.

With the addition of non-standard diagnostic instructions for communicating I/O configuration information via the diagnostic interface, the diagnostic controller 440 can load different sets of I/O configuration information into the reconfigurable device 400. This allows the testing of reconfigurable device 400 with multiple I/O standards. Additionally, the I/O configuration information, being relatively small in size, can be loaded relatively quickly through the diagnostic interface, enabling quick and efficient testing and debugging of the device 400 and its associated system. For example, a tester can modify the I/O configuration information so that a given pin outputs additional current over a connection to ensure the proper transmission of data. Moreover, the system can be tested with only the I/O configuration information, eliminating the need to finalize the configuration of the reconfigurable device 400. Further, a circuit board with device 400 can be tested without a configuration device.

Figure 5:
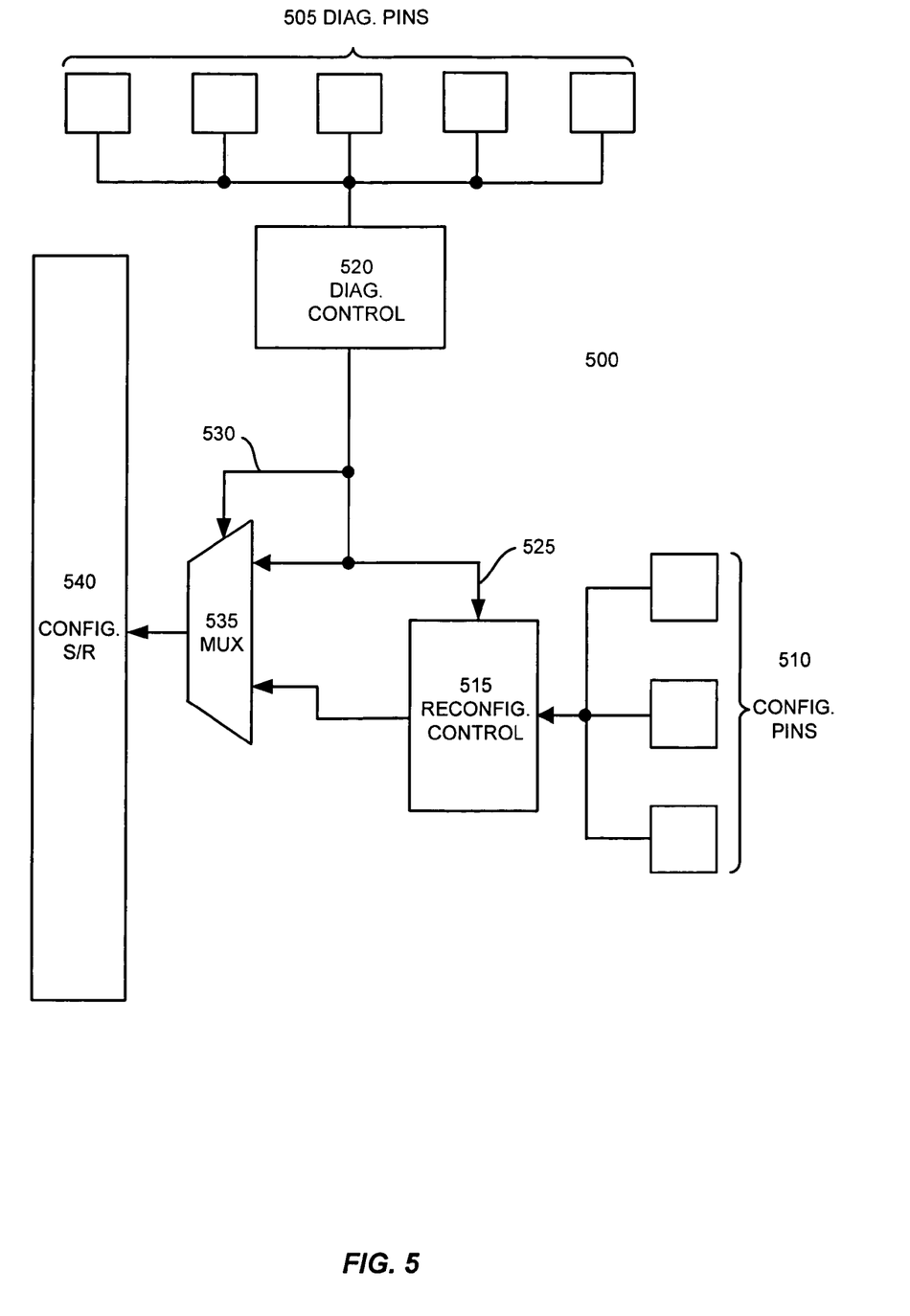
FIG. 5 illustrates a device having reconfigurable I/O connections according to a further embodiment of the invention.

FIG. 5 illustrates the interaction between a diagnostic controller and a reconfiguration controller in a reconfigurable device according to a further embodiment of the invention. Reconfigurable device 500 includes a diagnostic controller 520, similar to that discussed above, for coordinating the operation of diagnostic registers (not shown) in response to standard diagnostic instructions. A diagnostic interface 505, having data input and data output pins as discussed above, is connected with the diagnostic controller 520. In an embodiment, the diagnostic interface 505 is a five pin JTAG interface. Diagnostic controller 520 also communicates I/O configuration information between the diagnostic interface 505 and a configuration shift register 540 in response to non-standard diagnostic instructions. In an embodiment, I/O configuration information is communicated with the configuration shift register 540 through one or more serial data shifting operations, which shift data into or out of the configuration shift register 540 as needed.

A reconfiguration controller 515 coordinates the communication with a configuration device (not shown). The reconfiguration controller 515 is connected with a configuration device through configuration interface 510. In an embodiment, the configuration interface 510 includes a number of electrical connections to the configuration device. During a reconfiguration operation, the reconfiguration controller 515 loads I/O configuration information into the configuration shift register 540. In an embodiment, this is accomplished through one or more parallel load operations on the configuration shift register 540. Additionally, the reconfiguration controller 515 receives core configuration information for configuring the non-I/O related parts of reconfigurable device 500. In an embodiment, the reconfiguration controller 515 stores core configuration information in a separate core configuration memory (not shown).

Regardless of the source of the I/O configuration information (i.e. either the diagnostic interface 505 or the configuration interface 510), the I/O configuration information loaded into the configuration shift resister 540 determines the configuration of the I/O connections of the reconfigurable device 500. To avoid conflicts between I/O configurations from different sources, an embodiment of the diagnostic controller 520 is configured is configured to override the reconfiguration controller 515. Diagnostic controller 520 includes a connection 525 with the reconfiguration controller 515. The reconfiguration controller 515 is disabled when connection 525 is asserted. Additionally, a multiplexer 535 alternately connects either the reconfiguration controller 515 or diagnostic controller 520 with the configuration shift register 540. The multiplexer 535 is controlled with connection 530. The diagnostic controller 520 asserts connection 530 when I/O configuration information needs to be loaded from the diagnostic interface. During normal reconfiguration operations, connection 530 is not asserted and I/O configuration information is loaded from the configuration interface 510.

When a testing operation is initiated through the diagnostic interface, the diagnostic controller 520 asserts connection 525, which disables the reconfiguration controller 515 and halts any reconfiguration operation in progress. In many typical systems, reconfiguration is initiated automatically when the system is started. By allowing the diagnostic controller 520 to halt the reconfiguration process, the testing operation can be started without waiting for the time-consuming reconfiguration operation to be completed.

Following the completion of system testing, the system needs to be returned to its original state. This includes reconfiguring the reconfigurable devices back to their initial configurations. This can be done by either manually initiating a reconfiguration operation, or by loading the initial configurations into the reconfigurable devices via the diagnostic interface. Many typical reconfigurable devices have a dedicated reconfiguration trigger pin that can be pulsed or otherwise activated to restart the reconfiguration in case of an error in a previous reconfiguration operations. In order for a tester to take advantage of this feature, the diagnostic interface connector, such as discussed in FIG. 1, must be modified with an additional pin to be connected with the reconfiguration trigger pin. Unfortunately, this modification makes the diagnostic interface connector incompatible with standard diagnostic interfaces. Alternatively, a complete set of configuration information can be loaded through the diagnostic interface. However, as a complete set of configuration information is typically large and the diagnostic interface is typically slower than a configuration interface, this process is time consuming. Additionally, the tester needs to implement the complex logic and data storage required for configuring the reconfigurable device.

To address these problems, an embodiment of the invention includes a diagnostic controller on the reconfigurable device adapted to remotely trigger the reconfiguration process in response to an instruction from the diagnostic interface. Although this reconfiguration instruction is received via the diagnostic interface, the complete set of reconfiguration information is received from a configuration device via the configuration interface. This additional functionality of the diagnostic controller is enabled through one or more non-standard diagnostic instructions.

Figure 6:
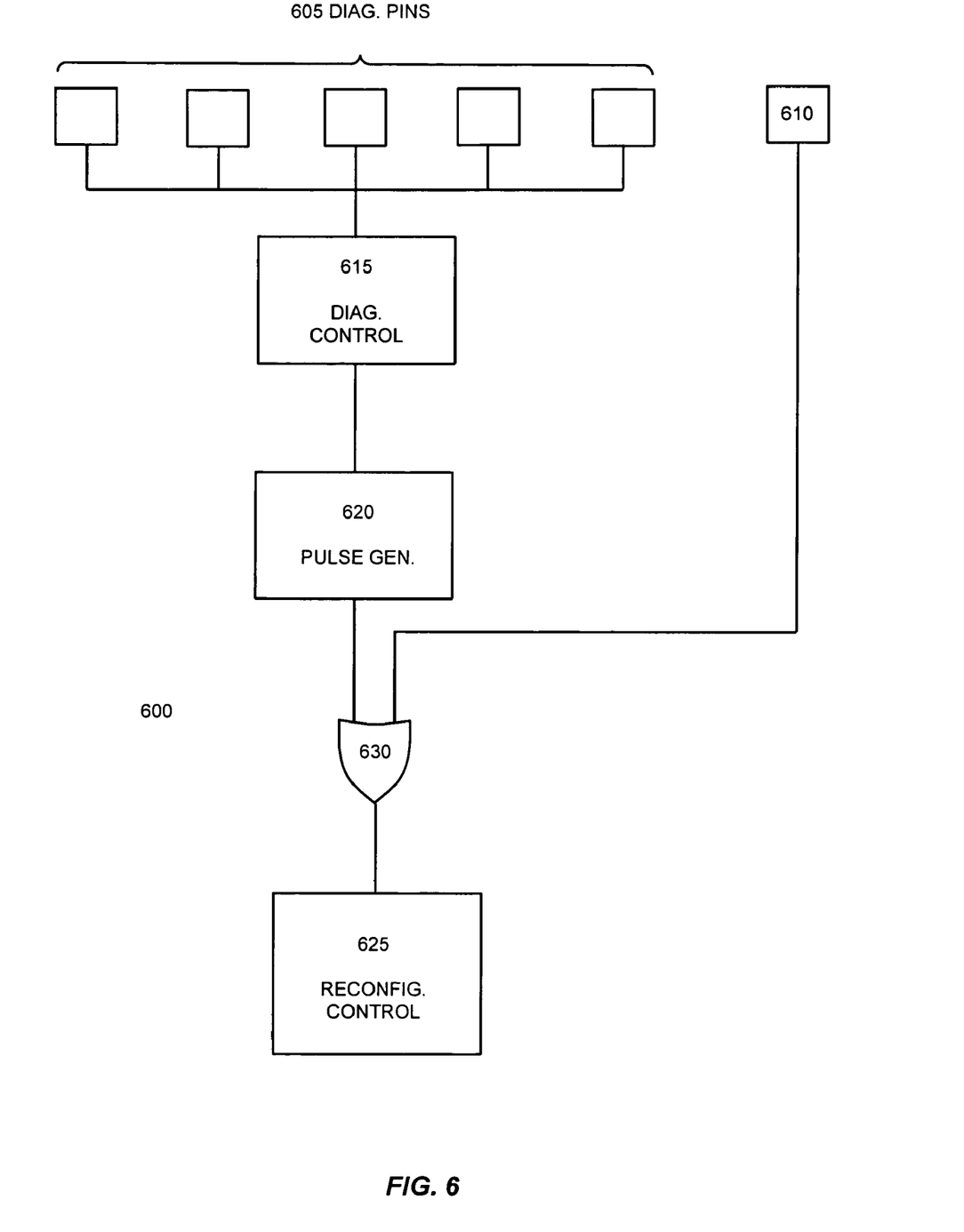
FIG. 6 illustrates a reconfigurable device having a reconfiguration input through a diagnostic interface according to an embodiment of the invention.

FIG. 6 illustrates a reconfigurable device 600 having a diagnostic controller adapted to remotely trigger the reconfiguration process according to an embodiment of the invention. Device 600 includes a diagnostic interface 605 connected with a diagnostic controller 615. Diagnostic controller 615 is responsive to standardized diagnostic instructions, such as those pertaining to the operation of diagnostic registers, as discussed above, and non-standard diagnostic instructions pertaining to the reconfiguration operation of reconfigurable device 600. Both standardized diagnostic instructions and non-standard diagnostic instructions are received via the diagnostic interface 605. The diagnostic controller 615 is adapted to respond to a non-standard diagnostic instruction requesting the initiation of the reconfiguration process.

In a further embodiment, diagnostic interface 605 is a JTAG interface. The diagnostic controller 615 is responsive to standard JTAG instructions. As the JTAG standard allows for the definition of additional non-JTAG instructions, non-JTAG instructions can also be communicated over the same serial data bus as standard JTAG instructions, eliminating the need for additional pins or circuit traces.

Device 600 includes a reconfiguration trigger pin 610 and a reconfiguration controller 625. Pin 610 is pulsed or otherwise asserted by an external source to signal to the reconfiguration controller 625 to begin the reconfiguration process. The reconfiguration controller 625 then retrieves a complete set of configuration information via the configuration interface (not shown). The diagnostic controller 615 is connected with pulse generator 620. Pulse generator 620 emulates the signal received by reconfiguration trigger pin 610 when a reconfiguration process is initiated by an external source.

Upon receiving a request via the diagnostic interface 605 to initiate the reconfiguration process, the diagnostic controller 615 activates the pulse generator 620. The pulse generator 620 is connected with the reconfiguration controller 625 through the OR gate 630. In response to a signal from the reconfiguration trigger pin 610 or the pulse generator 620, the reconfiguration controller initiates the reconfiguration process by retrieving a complete set of configuration information via the configuration interface.

This embodiment of the invention has several advantages. By adapting the diagnostic controller 615 to use an additional diagnostic instruction to trigger the reconfiguration process, the diagnostic interface connector does not need to be modified with an additional pin to be connected with the reconfiguration trigger pin. Additionally, because the reconfiguration process is performed through the configuration interface, rather than the diagnostic interface, the tester does not need to implement the complex logic and data storage required for configuring the reconfigurable device. Further, the configuration process is performed relatively quickly over the configuration interface as compared with the same process performed over the diagnostic interface.

Those skilled in the art will appreciate that the present invention establishes system for reconfiguring I/O connections of a reconfigurable device through a diagnostic interface and for triggering a reconfiguration operation through a diagnostic interface. The present invention has been described in relation to particular embodiments that are intended in all respects to be illustrative rather than restrictive. Therefore, it should be understood that the method and apparatus of the present invention could be practiced with modification and alteration within the spirit and scope of the claims herein. Furthermore, the invention may be implemented in any combination of hardware and/or software. Alternative embodiments will become apparent to those skilled in the art to which the present invention pertains without departing from its spirit and scope.

What is claimed is:

1. A device comprising:
    an I/O connection having a plurality of independently configurable attributes, wherein the I/O connection is adapted to communicate an I/O value;
    a configuration memory adapted to store a first attribute value that configures at least one configurable attribute from the plurality of configurable attributes;
    a diagnostic interface adapted to communicate the I/O value; and
    a diagnostic controller having a first mode adapted to communicate the I/O value between the I/O connection and the diagnostic interface and having a second mode adapted to receive the first attribute value from the diagnostic interface and to store the first attribute value in the configuration memory, wherein the at least one configurable attribute of the I/O connection is configured by the first attribute value.

2. The device of claim 1, wherein the second mode is further adapted to read a second attribute value previously stored in the configuration memory and to send the second attribute value to the diagnostic interface, wherein the second attribute value previously configured the at least one configurable attribute.

3. The device of claim 1, wherein the configuration memory is further adapted to store a second attribute value that configures a second configurable attribute; and wherein the second mode of the diagnostic controller does not store the second attribute value in the configuration memory, wherein the second configurable attribute is unassociated with the I/O connection.

4. The device of claim 3, wherein the configuration memory comprises a I/O configuration memory adapted to store the first attribute value and a core configuration memory adapted to store the second configurable attribute value.

5. The device of claim 2, wherein the I/O configuration memory comprises a shift register adapted to shift in and store the first attribute value and to shift out and output the second attribute value.

6. The device of claim 1, wherein the diagnostic interface comprises a serial data connection.

7. The device of claim 6, wherein the serial data connection is adapted to receive a second I/O value from an I/O connection of a second device and to send the second I/O value to a third device.

8. The device of claim 7, wherein the diagnostic interface is a JTAG interface.

9. The device of claim 1, further comprising:
a configuration interface adapted to receive a set of attribute values for a set of configurable attributes of the device from a configuration device; and
a configuration controller adapted to store the set of attribute values in the configuration memory, thereby configuring the set of configurable attributes of the device.

10. The device of claim 9, wherein the set of attribute values include a second attribute value configuring the configurable attribute of the I/O connection.

11. The device of claim 9, wherein the second mode of the diagnostic controller disables the configuration controller.

12. The device of claim 9, wherein the configuration controller is further adapted to receive a signal and to retrieve the set of attribute values in response to the signal.

13. The device of claim 12, wherein the signal is received from a source external to the device.

14. The device of claim 12, wherein the signal is received from the diagnostic controller.

15. The device of claim 14, wherein the diagnostic controller further includes a third mode for receiving a configuration instruction from the diagnostic interface and generating the signal in response to the configuration instruction.

16. The device of claim 15, wherein the diagnostic controller further includes a pulse generator for generating the signal.

17. The device of claim 1, wherein the device is an integrated circuit.

18. The device of claim 1, wherein the device is a programmable logic device.

19. The device of claim 1, further comprising:
a system having a plurality of devices connected with the device.

20. The device of claim 19, wherein the system further includes a configuration device.

21. The device of claim 1, further comprising:
a circuit board having a plurality of additional devices mounted thereto, such that the device is connected with at least one other device on the circuit board.

22. The device of claim 21, wherein the circuit board further includes a configuration device.

23. A device comprising:
an I/O connection that is reconfigurable with respect to a plurality of configurable attributes and adapted to communicate an I/O value;
a set of configurable attributes defining the function of the device and configuration of the I/O connection;
a configuration memory adapted to store a set of attribute values configuring the configurable attributes;
a configuration interface adapted to receive the set of attribute values from a configuration device; and
a configuration controller adapted to store in the configuration memory the set of attribute values received by the configuration interface in response to a configuration signal wherein the set of attribute values configure the set of configurable attributes of the device and the I/O connection;
a diagnostic interface adapted to communicate the I/O value of the I/O connection; and
a diagnostic controller having a first mode adapted to communicate the I/O value between the I/O connection and the diagnostic interface and having a second mode adapted to send the configuration signal to the configuration controller.

24. The device of claim 23, wherein the diagnostic controller is further adapted to receive a configuration instruction from the diagnostic interface and to send the configuration signal to the configuration controller in response to the configuration instruction.

25. The device of claim 23, wherein the diagnostic controller further includes a pulse generator for generating the configuration signal.

26. The device of claim 23, wherein the configuration controller is further adapted to receive the configuration signal from a source external to the device.

27. The device of claim 23, wherein the device is an integrated circuit.

28. The device of claim 23, wherein the device is a programmable logic device.

29. A method for configuring an attribute of an I/O connection of a reconfigurable device comprising:
receiving a diagnostic instruction from a diagnostic interface;
communicating an I/O value from the I/O connection to the diagnostic interface when the diagnostic instruction is of a first type;
receiving an attribute value from a plurality of attribute values associated with the attribute of the I/O connection from the diagnostic interface when the diagnostic instruction is of a second type; and
storing the attribute value in a configuration memory, wherein the I/O connection is configured from a first state to a second state in response to the attribute value when the diagnostic instruction is of the second type, wherein storing the attribute value comprises:
shifting the attribute value into a shift register;
shifting a previously stored attribute value of the I/O connection out of the shift register; and
communicating the previously stored attribute value with the diagnostic interface.

30. A method for configuring an attribute of an I/O connection of a reconfigurable device comprising:
receiving a diagnostic instruction from a diagnostic interface;
communicating an I/O value from the I/O connection to the diagnostic interface when the diagnostic instruction is of a first type;

receiving an attribute value from a plurality of attribute values associated with the attribute of the I/O connection from the diagnostic interface when the diagnostic instruction is of a second type;

storing the attribute value in a configuration memory, wherein the I/O connection is configured from a first state to a second state in response to the attribute value when the diagnostic instruction is of the second type;

receiving a configuration signal via the diagnostic interface;

retrieving a set of attribute values defining the function of the reconfigurable device from a configuration device via a configuration interface in response to the configuration signal; and storing the set of attribute values in the configuration memory, thereby defining the function of the reconfigurable device.

31. The method of claim 30, wherein the set of attribute values includes a second attribute value associated with the attribute of the I/O connection.

32. The method of claim 30, wherein receiving the configuration signal, retrieving the set of attribute values, and storing the set of attribute values are disabled when the diagnostic instruction is of the second type.

33. A system having a plurality of devices, the system comprising:

a reconfiguration device having a stored set of device attributes;

a reconfigurable device having a set of configurable attributes and adapted to receive the stored set of device attributes, thereby configuring the reconfigurable device; and a diagnostic interface adapted to interface with the reconfigurable device and with an external testing device, thereby communicating an I/O value associated with an I/O connection of the reconfigurable device to the external testing device, wherein the I/O connection is reconfigurable in response to one or more of the stored set of device attributes;

wherein the reconfigurable device includes a configuration controller adapted to initiate the reception of the stored set of device attributes in response to a configuration signal, and a diagnostic controller having a first mode adapted to communicate the I/O value between the I/O connection and the diagnostic interface and having a second mode adapted to send the configuration signal to the configuration controller, wherein the I/O connection is reconfigured in response to at least one of the device attributes.

34. The system of claim 33, wherein the diagnostic controller is further adapted to receive from the diagnostic interface a second set of device attributes adapted to configure the reconfigurable device.

35. The system of claim 33, wherein the diagnostic controller is further adapted to send the configuration signal to the configuration controller in response to a configuration instruction received from the diagnostic interface.

36. The system of claim 33, wherein the configuration controller is further adapted to receive the configuration signal from a source external to the device.

37. The system of claim 33, wherein the diagnostic interface is a JTAG interface.

* * * * *